United States Patent [19]

Yamazaki et al.

[11] Patent Number: 5,040,293
[45] Date of Patent: Aug. 20, 1991

[54] BONDING METHOD

[75] Inventors: Nobuto Yamazaki; Akihiro Nishimura, both of Tokyo, Japan

[73] Assignee: Kabushiki Kaisha Shinkawa, Tokyo, Japan

[21] Appl. No.: 523,398

[22] Filed: May 14, 1990

[30] Foreign Application Priority Data

May 15, 1989 [JP] Japan .................................. 1-118597

[51] Int. Cl.$^5$ .............................................. H01R 9/09
[52] U.S. Cl. ........................................ 29/843; 29/833;
228/4.5; 228/180.2; 357/70; 437/182; 437/220
[58] Field of Search ..................... 228/49.1, 4.5, 180.2;
29/840, 843, 833, 827, 7.40; 357/70; 437/182, 220

[56] References Cited

U.S. PATENT DOCUMENTS

| | | | |
|---|---|---|---|
| 3,722,072 | 3/1973 | Beyerlein | 228/180.2 |
| 3,941,297 | 3/1976 | Burns et al. | 228/4.5 X |
| 4,347,964 | 9/1982 | Takasugi et al. | 228/4.5 |
| 4,415,917 | 11/1983 | Chiba et al. | 357/70 |
| 4,838,472 | 6/1989 | Scavino | 228/4.5 |
| 4,855,928 | 8/1989 | Yamanaka | 228/4.5 X |

FOREIGN PATENT DOCUMENTS 54-124677  9/1979  Japan .................................. 357/70

Primary Examiner—Carl J. Arbes
Attorney, Agent, or Firm—Koda and Androlia

[57] ABSTRACT

A bonding method for bonding inner leads on a film to electrodes of semiconductor elements is performed by the steps of: individually positioning the film and semiconductor elements at a predetermined bonding position; individually recognizing the positions of the inner leads and electrodes; selecting a combination of one inner lead and one electrode which are positionally shifted relative to each other; correcting relative position of the inner lead and electrode which are positionally shifted so that the inner lead and electrode are aligned; the inner lead and electrode are bonded; relative positions of remaining inner leads and elctrodes are aligned; and the inner leads and elctrodes are individually connected by bonding.

2 Claims, 3 Drawing Sheets

BONDING METHOD

BACKGROUND OF THE INVENTION

1. Field of the Invention

The present invention relates to a bonding method for individually connecting inner leads provided on a film and electrodes of semiconductor elements.

2. Prior Arts

In conventional bonding methods in which inner leads provided on a film are bonded individually to electrodes of a semiconductor element, the positional matching of corresponding inner leads and electrodes are conducted by way of pattern recognition so that the positioning of the leads and electrodes can create an average amount of discrepancy.

Meanwhile, the number of inner leads which are displaced from their normal positions on films is generally several percent per lot. As a result, if the positional matching is performed under the above-described circumstances (wherein the inner leads and electrodes have an average amount of positional discrepancy), the inner leads and the centers of corresponding electrodes are seriously out of alignment. Such misalignments are defects, and the yield of the bonding work drops.

SUMMARY OF THE INVENTION

Accordingly, the object of the present invention is to provide a bonding method which performs bonding after aligning the inner leads of a film with the centers of electrodes on semiconductor elements (within permissible limits) even in cases where some of the inner leads of the film are displaced, thus improving the yield of the bonding work.

The object of the present invention is accomplished by (a) individually positioning film and semiconductor elements in a predetermined bonding position, (b) individually recognizing (locating) the positions of the electrodes on each semiconductor element, (c) selecting a combination of one inner lead and one electrode (which are to be connected) whose positions are shifted relative to each other, (d) correcting and aligning the relative positions of such a combination, (e) connecting the inner lead and electrode by bonding, (f) aligning, in an average manner, the relative positions of the remaining inner leads and electrodes, and (g) then individually connecting the remaining inner leads and electrodes by bonding.

In operation, the relative positions of a combination of one inner lead and one electrode (which are to be connected) having positions shifted relative to each other are first corrected and aligned, and then the inner lead and electrode are connected by bonding. Thereafter, when the relative positions of the remaining inner leads and electrodes are aligned in an average manner, the inner lead which is already connected undergoes plastic deformation and is returned to its normal position. Then, the inner leads and electrodes remaining in their normal positions are bonded, so that the bonding connection work is completed.

DETAILED DESCRIPTION OF THE INVENTION

One embodiment of the present invention will be described below with reference to the attached drawings.

Figure 2:
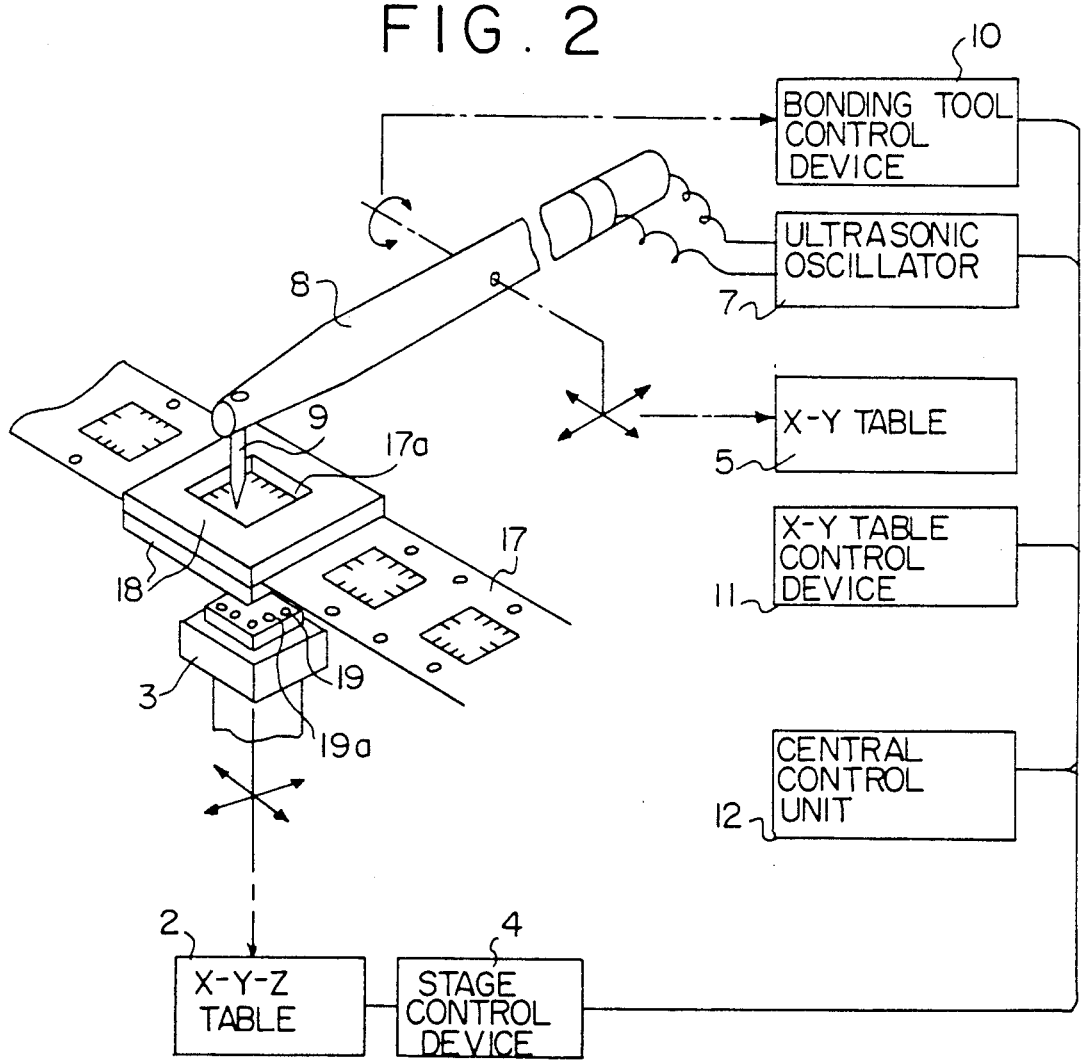
FIG. 2 is an explanatory diagram which illustrates a bonding control system in the method of the present invention.
Figure 3:
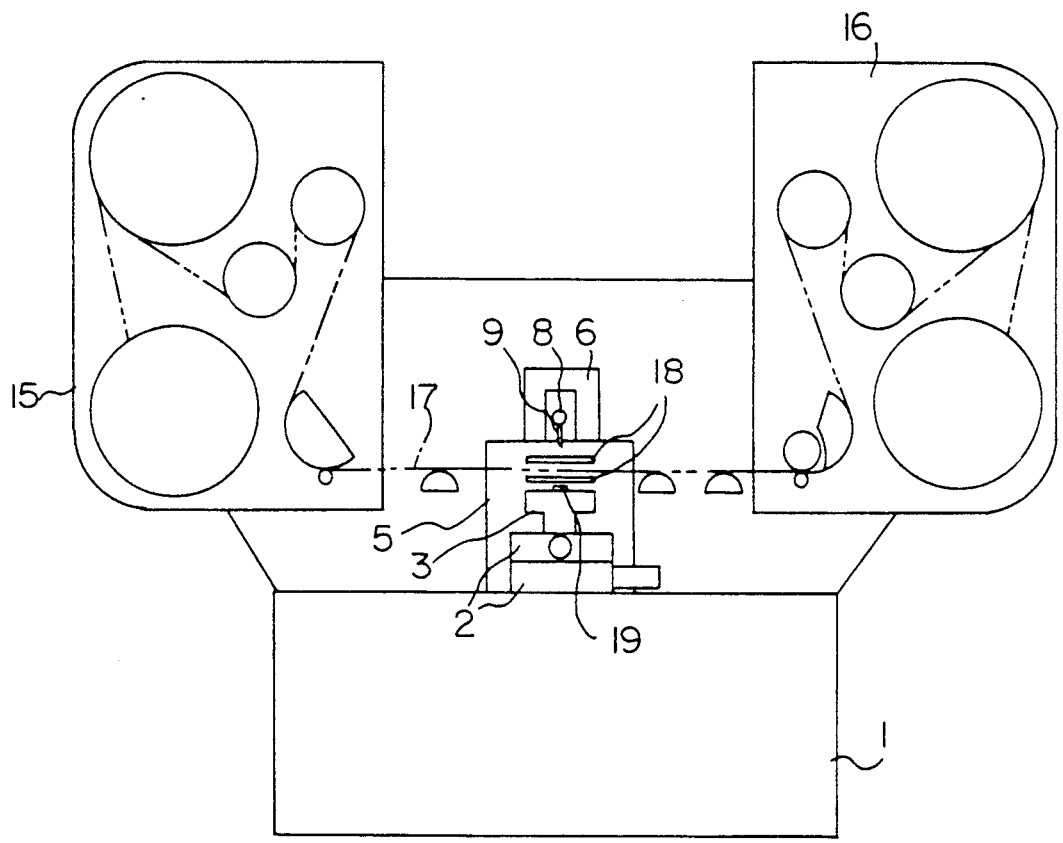
FIG. 3 is a rough diagram of a tape bonder which uses the bonding method of the present invention.

The tape bonder used in the bonding method of the present invention is constructed as shown in FIGS. 2 and 3. Specifically, an X-Y-Z table 2 which can move along three perpendicular coordinate axes (horizontal and lateral directions) is installed on a base 1. A stage 3 is secured to the surface of the X-Y-Z table 2 which moves in the X, Y and Z directions by a stage control device 4.

On the base 1 is further provided with an X-Y table 5, and bonding head 6 is mounted on the X-Y table 5. A horn 8 which is caused to vibrate by an ultrasonic oscillator 7 is installed on the bonding head 6 so that the horn 8 can pivot or move upward and downward. A bonding tool 9 which is installed at one end of the horn 8 is pivoted or moved upward and downward by a bonding tool vertical movement control device ("bonding tool control device") 10. The X-Y table 5 is driven in the X and Y directions by X-Y table control device.

The stage control device 4, the bonding tool control device 10 and X-Y table control device 11 are operated by commands from a central control unit 12.

A film supply 15 and a film take-up 16 (both from prior art) are installed above the stand 1 on either side of the bonding head 6. The film supply 15 is on the left side, and the film take-up 16 is on the right side.

A film 17 having inner leads is fed out from the film supply 15 and is fed at prescribed intervals so that it is clamped and positioned by a clamper 18 which is installed above the stage 3. Then, the inner leads 17a of the film 17 and the electrodes 19a of a semiconductor element 19 (which is fed onto the stage 3 by means of a supply and transporting device [not shown]) are bonded by the bonding tool 9. Thereafter, the film 17 is taken up by the film take-up 16.

The bonding method used in the bonder described above will be described below with reference to FIG. 1.

The film 17 is positioned by the clamper 18, and at the same time, the X-Y-Z table 2 is moved so that a semiconductor element 19 is positioned in a predetermined position directly beneath the film 17.

Next, the positions of the inner leads 17a of the film 17 and the electrodes 19a of the semiconductor element 19 are detected by a detection device (not shown). Then, a combination of positions of the inner lead and electrode, in which the discrepancy in the relative positions of the centers of the inner leads 17a and the electrodes 19a will exceed permissible limits if the inner leads and electrodes are bonded "as is", is detected.

Figure 1A:
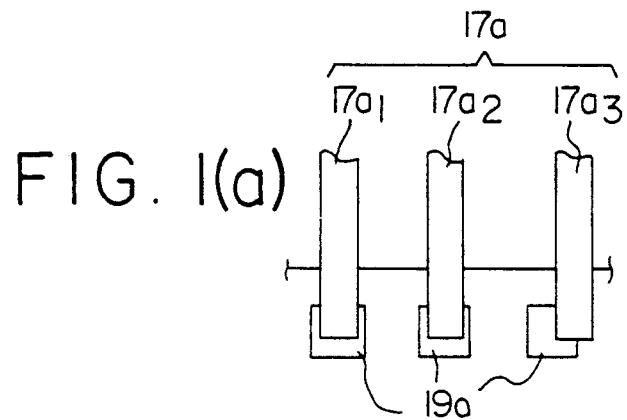
FIGS. 1(a), 1(b) and 1(c) are explanatory diagrams illustrating the bonding method of the present invention.
Figure 1B:
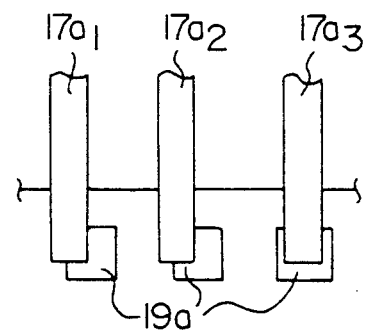

More specifically, in FIG. 1(a) the inner leads $17a_1$ and $17a_2$ are within permissible limits, and the inner lead $17a_3$ is over the permissible limits. In this case, the X-Y-Z table 2 is moved by a very small amount, so that the discrepancy in the relative positions of the selected inner lead $17a_3$ and electrode 19a is corrected and the inner lead $17a_3$ and electrode 19a are aligned as shown in FIG. 1(b). When it has been confirmed that the centers of the inner lead $17a_3$ and electrode 19a coincide, the horn 8 is caused to pivot so that the bonding tool 9 is lowered, and bonding is performed so that the inner lead $17a_3$ and electrode $19a$ are connected.

If there is another combination of an inner lead $17a$ and electrode $19a$ which shows a discrepancy in relative position over the permissible limits, the connection is made there in the same manner.

Figure 1C:
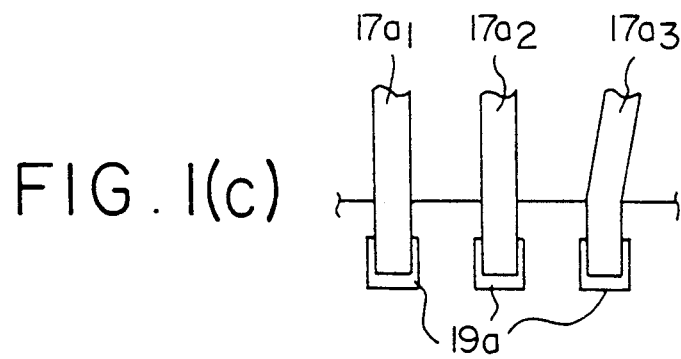

Regarding the remaining normal inner leads $17a_1$ and $17a_2$, since the positions of inner leads prior to the alignment of the selected displaced inner lead $17a_3$ and electrode $19a$ (i.e., the positions shown in FIG. 1 (a)) are the normal positions of inner leads, the X-Y-Z table 2 is moved so that the semiconductor element 19 is returned to its original position as shown in FIG. 1 (c).

As a result of this movement of the semiconductor element 19, the inner lead $17a_3$ which has already been connected undergoes plastic deformation and is returned to its normal position. Then, the connection work is performed by bonding the inner leads $17a_1$ and $17a_2$ (which remain in their normal positions) to the corresponding electrodes $19a$.

As described above, according to the bonding method of the present invention, the centers of inner leads and corresponding electrodes are aligned and bonded even if some leads are displaced on the film, and then, the remaining nondisplaced inner leads and corresponding electrodes are returned to their normal positions and bonded. Accordingly, even if some inner leads are displaced on the film, there is no need to reject the film as defective, resulting in that the yield of the bonding work is improved.

We claim:

1. A tape bonding method in which inner leads on a film and electrodes on semiconductor elements are individually connected, wherein (a) the film and semiconductor elements are individually positioned in a prescribed bonding position, (b) the positions of the inner leads on the film and the positions of the electrodes on each semiconductor element are individually recognized, (c) a combination of one inner lead and one electrode which are to be connected and have positions shifted relative to each other is selected. (d) the relative positions of said combination are corrected and aligned, (e) said inner lead and electrode are individually connected by bonding, (f) the relative positions of the remaining inner leads and electrodes are aligned in an average manner, and (g) said inner leads and electrodes are individually connected by bonding.

2. A tape bonding method for bonding inner leads installed on a film to electrodes of semiconductor elements comprising the steps of:

individually positioning said film and semiconductor elements in a predetermined bonding position;

individually recognizing the positions of said inner leads of said film and said electrodes of each semiconductor element;

selecting a combination of one inner lead and one electrode which are positionally shifted relative to each other;

correcting relative position of said inner lead and electrode which are positionally shifted so that said inner lead and electrode are aligned;

said inner lead and electrode are individually connected by bonding;

relative positions of remaining inner leads and electrodes are aligned in an average manner; and said inner leads and electrodes are individually connected by bonding.

* * * * *